United States Patent
May

(10) Patent No.: US 7,601,643 B1
(45) Date of Patent: Oct. 13, 2009

(54) ARRANGEMENT AND METHOD FOR FABRICATING A SEMICONDUCTOR WAFER

(75) Inventor: Charles E. May, Gresham, OR (US)

(73) Assignee: LSI Logic Corporation, Milpitas, CA (US)

(*) Notice: Subject to any disclaimer, the term of this patent is extended or adjusted under 35 U.S.C. 154(b) by 0 days.

(21) Appl. No.: 09/943,196

(22) Filed: Aug. 30, 2001

(51) Int. Cl.
*H01L 21/302* (2006.01)

(52) U.S. Cl. .................. 438/692; 438/689; 438/690; 216/37; 216/74; 216/79; 216/88; 216/89

(58) Field of Classification Search .................. 438/692; 252/79.1, 79.4; 510/176; 216/88
See application file for complete search history.

(56) References Cited

U.S. PATENT DOCUMENTS

| | | | | |
|---|---|---|---|---|
| 3,874,129 A | * | 4/1975 | Deckert et al. ............... 451/41 |
| 4,064,660 A | * | 12/1977 | Lampert ...................... 451/41 |
| 5,318,927 A | * | 6/1994 | Sandhu et al. ................. 438/3 |
| 5,733,177 A | * | 3/1998 | Tsuchiya et al. .............. 451/41 |
| 5,780,358 A | * | 7/1998 | Zjou et al. ................... 438/645 |
| 5,869,392 A | * | 2/1999 | Kimura ....................... 438/620 |
| 5,934,980 A | * | 8/1999 | Koos et al. ................... 451/41 |
| 5,985,045 A | * | 11/1999 | Kobayashi .................. 148/240 |
| 6,001,730 A | * | 12/1999 | Farkas et al. ................. 438/627 |
| 6,106,728 A | * | 8/2000 | Iida et al. .................... 210/743 |
| 6,126,514 A | * | 10/2000 | Muroyama ................... 451/36 |
| 6,436,830 B1 | * | 8/2002 | Merchant et al. ............ 438/692 |

FOREIGN PATENT DOCUMENTS

| JP | 08330262 A | * | 12/1966 |
|---|---|---|---|
| JP | 2001139935 A | * | 5/2001 |

OTHER PUBLICATIONS

Muroyama et al., Slurry for Polsihing and Manufacture of Semiconductor Device, Dec. 13, 1996, English Abstract of JP 08330262 A2, 2 pp.*
Muroyama et al. Slurry for Polsihing, and Manufacture of Semiconductor Device, Dec. 13, 1996, Computer translation of JP 08330262 A., 5 pp.*
Ri et al., Composition for Polishing, May 22, 2001, English Abstract of JP 20001139935-A, 1 page.*
Ri et al., Composition for Polishing, May 22, 2001, Computer translation of JP 20001139935-A into English, 8 pp.*

* cited by examiner

*Primary Examiner*—Duy-Vu Deo
*Assistant Examiner*—Maki Angadi
(74) *Attorney, Agent, or Firm*—Maginot, Moore & Beck

(57) ABSTRACT

An arrangement and method for fabricating a semiconductor wafer which utilizes a nonaqueous solvent rinse is disclosed.

20 Claims, 2 Drawing Sheets

ARRANGEMENT AND METHOD FOR FABRICATING A SEMICONDUCTOR WAFER

TECHNICAL FIELD OF THE INVENTION

The present invention relates generally to an arrangement and method for fabricating a semiconductor wafer, and more particularly to an arrangement and method for fabricating a semiconductor wafer which utilizes a nonaqueous solvent rinse.

BACKGROUND OF THE INVENTION

Semiconductor integrated circuit devices are typically fabricated by a layering process in which several layers of material (e.g. a dielectric and a metal such as copper) are fabricated (i) on a surface of a semiconductor wafer, or (ii) on a surface of a previous layer. This fabrication process very often requires layers to be fabricated upon a smooth, planar surface of a previous layer. However, the surface topography of layers may be highly uneven due to (i) areas which are higher than the remainder of the surface or (ii) an uneven topography of an underlying layer. As a result, a layer may need to be polished so as to present a smooth planar surface for the next processing step, such as formation of a conductor layer or pattern on the surface of another layer.

In general, a semiconductor wafer may be polished to remove high topography and surface defects such as crystal lattice damage, scratches, roughness, or embedded particles of dirt or dust. The polishing process typically is accomplished with a polishing system that includes top and bottom platens (e.g. a polishing table and a wafer carrier or holder), between which the semiconductor wafer is positioned. The platens are moved relative to each other thereby causing material to be removed from the surface of the semiconductor wafer to a desired end point. This polishing process is often referred to as mechanical planarization (MP) and is utilized to improve the quality and reliability of semiconductor devices. The polishing process may also involve the introduction of a chemical slurry which may chemically react with the surface of the semiconductor wafer so as to facilitate higher removal rates of materials fabricated upon the semiconductor wafer. This polishing process is often referred to as chemical mechanical planarization or chemical mechanical polishing (CMP).

Once the CMP is completed the wafer surface is rinsed with an aqueous solution in an attempt to wash away material left there by the CMP process (e.g. slurry residue and/or other reaction products). Subsequent to the rinse, the semiconductor wafer surface is also scrubbed with a brush in the presence of water in an attempt to further remove any material left there by the CMP process which is trapped in tiny crevices or channels defined in the surface of the wafer. Once the rinse and scrub procedures are completed the deposition of an additional material onto the polished surface of the semiconductor wafer can take place. The above described procedure is then repeated until the desired multi-layer structure is obtained.

A drawback to the above described fabrication procedure is that the rinsing and brushing procedures can fail to remove a sufficient amount of the material left on the surface of the semiconductor wafer by the CMP process. Failing to remove a sufficient amount of the material left on the surface of the semiconductor wafer by the CMP process can result in yield and/or reliability problems for thereafter fabricated semiconductor integrated circuit devices.

Thus, a continuing need exists for an arrangement and method which efficiently removes CMP residue and/or other reaction products from a surface of a semiconductor wafer.

SUMMARY OF THE INVENTION

In accordance with one embodiment of the present invention, there is provided a method of fabricating a semiconductor wafer. The method includes (a) polishing a semiconductor wafer with a polishing pad and (b) disposing a volume of a nonaqueous solvent onto the semiconductor wafer.

In accordance with another embodiment of the present invention, there is provided a method of fabricating a semiconductor wafer. The method includes (a) subjecting a front side of the semiconductor wafer to chemical mechanical polishing and (b) disposing a volume of a nonaqueous solvent onto the front side of the semiconductor wafer.

In accordance with yet another embodiment of the present invention, there is provided an arrangement for fabricating a semiconductor wafer. The arrangement includes (i) a polishing pad positioned in contact with a side of the semiconductor wafer, (ii) a chemical slurry system for storing an aqueous slurry, the chemical slurry system being operatively coupled to the semiconductor wafer so that the chemical slurry system can dispose a volume of the aqueous slurry onto the side of the semiconductor wafer, and (iii) a nonaqueous solvent storage system for storing a nonaqueous solvent, the nonaqueous solvent storage system being operatively coupled to the semiconductor wafer so that the nonaqueous solvent storage system can dispose a volume of the nonaqueous solvent onto the side of the semiconductor wafer.

It is an object of the present invention to provide a new and useful arrangement and method of fabricating a semiconductor wafer.

It is another object of the present invention to provide an improved arrangement and method of fabricating a semiconductor wafer.

It is a further object of the present invention to provide an arrangement and method of fabricating a semiconductor wafer which enhances the selective removal of residue and reaction products generated by a CMP process from a semiconductor wafer surface.

The above and other objects, features, and advantages of the present invention will become apparent from the following description and the attached drawings.

DETAILED DESCRIPTION OF A PREFERRED EMBODIMENT

Figure 1:
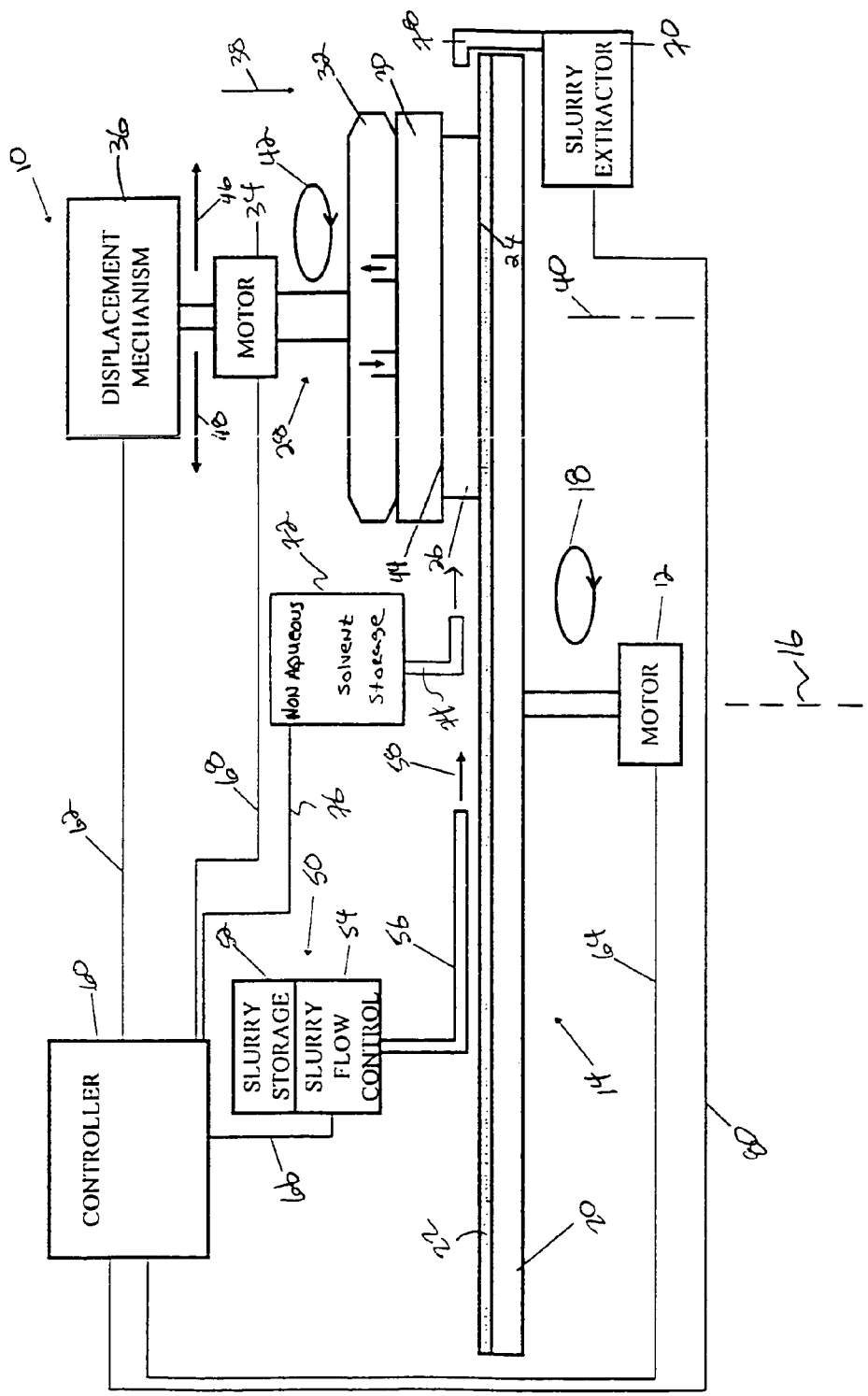
FIG. 1 shows a schematic representation of a CMP arrangement of the present invention.

While the invention is susceptible to various modifications and alternative forms, a specific embodiment thereof has been shown by way of example in the drawings and will herein be described in detail. It should be understood, however, that there is no intent to limit the invention to the particular form disclosed, but on the contrary, the intention is to cover all modifications, equivalents, and alternatives falling within the spirit and scope of the invention as defined by the appended claims.

As discussed above, fabrication of semiconductor integrated circuit devices can include (i) layering a material on a surface of a semiconductor wafer, (ii) subjecting the surface of the semiconductor wafer to CMP so as to polish or planarize the surface of the semiconductor wafer, (iii) rinsing the surface of the semiconductor wafer, (iv) scrubbing the surface of the semiconductor wafer, and (v) laying additional material on the polished surface of the semiconductor wafer. With respect to subjecting the semiconductor wafer to CMP, an exemplary CMP arrangement 10 which can be utilized in the present invention is schematically illustrated in FIG. 1. In particular, CMP arrangement 10 includes a platen motor or other drive mechanism 12 and a platen assembly 14. The platen motor 12 rotates the platen assembly 14 about a center axis 16. The platen motor 12 may rotate the platen assembly 14 in a clockwise direction (as shown by arrow 18 of FIG. 1) or in the counterclockwise direction.

The platen assembly 14 includes a polishing platen 20 and a polishing pad 22 mounted on the polishing platen 20. Both the polishing platen 20 and the polishing pad 22 are preferably circular and collectively define a polishing area or surface against which a front side 24 of a semiconductor wafer 26 may be polished. Moreover, the polishing pad 22 is typically made of blown polyurethane which protects the polishing platen 20 from chemical slurry and other chemicals introduced during the polishing process.

The CMP arrangement 10 also includes a polishing head assembly 28. The polishing head assembly 28 includes a wafer carrier 30, a cooling mechanism 32, a wafer carrier motor or other drive mechanism 34, and a wafer carrier displacement mechanism 36. The wafer carrier 30 applies a controlled, adjustable force in the general direction of arrow 38 in order to press the front side 24 of the semiconductor wafer 26 into contact with the polishing pad 22 so as to facilitate polishing of the front side 24 of the semiconductor wafer 26.

The wafer carrier motor 34 rotates the wafer carrier 30 and the semiconductor wafer 26 about a center axis 40. The wafer carrier motor 34 may rotate the wafer carrier 30 in a clockwise direction (as shown by arrow 42 of FIG. 1) or in the counterclockwise direction. However, the wafer carrier motor 34 preferably rotates the wafer carrier 30 in the same rotational direction as the platen motor 12 rotates the platen assembly 14 (although the wafer carrier motor 34 may rotate the semiconductor wafer 26 in the rotational direction opposite the rotational direction of the platen assembly 14 as desired).

The wafer carrier 30 also includes mechanisms (not shown) for holding the semiconductor wafer 26. For example, the wafer carrier 30 may include a vacuum-type mechanism which generates a vacuum force that draws the semiconductor wafer 26 against the wafer carrier 30. Once the semiconductor wafer 26 is positioned on the wafer carrier 30 and held in contact with the platen assembly 14 for polishing, the vacuum force may be removed. In such an arrangement, the wafer carrier 30 may be designed with a friction surface or a carrier pad which engages a back side 44 of the semiconductor wafer 26. Such a carrier pad, along with the force being applied in the general direction of arrow 38, creates a frictional force between the wafer carrier 30 and the semiconductor wafer 26 that effectively holds the semiconductor wafer 26 against the wafer carrier 30 thereby causing the semiconductor wafer 26 to rotate at the same velocity as the wafer carrier 30. It should be appreciated that such wafer carriers and carrier pads are of conventional design and are commercially available.

The cooling mechanism 32 counteracts heat generated during the polishing process in order to maintain the wafer carrier 30 at a substantially constant temperature. In particular, the cooling mechanism 32 neutralizes the heat generated due to friction and a chemical slurry reacting with the front side 24 of the semiconductor wafer 26.

The displacement mechanism 36 selectively moves the wafer carrier 30 and hence the semiconductor wafer 26 across the platen assembly 14 in the general direction of arrows 46 and 48. Such movement defines a polishing path which may be linear, sinusoidal, or a variety of other patterns. The wafer carrier displacement mechanism 36 is also capable of moving the semiconductor wafer 26 along a polishing path to a location beyond the edge of the polishing pad 22 so that the semiconductor wafer 26 "overhangs" the edge. Such an overhanging arrangement permits the semiconductor wafer 26 to be moved partially on and partially off the polishing pad 22 to compensate for polishing irregularities caused by a relative velocity differential between the faster moving outer portions and the slower moving inner portions of the platen assembly 14.

The CMP arrangement 10 also includes a chemical slurry system 50. The slurry system 50 includes a slurry storage reservoir 52, a slurry flow control mechanism 54, and a slurry conduit 56. The slurry storage reservoir 52 includes one or more containers for storing slurry. In particular, the slurry storage reservoir 52 contains aqueous chemical slurry that includes abrasive material which facilitates polishing of the front side 24 of the semiconductor wafer 26. Chemical slurries having such properties are well known and commercially available.

The slurry flow control mechanism 54 controls the flow of slurry from the slurry storage 52, through the slurry conduit 56, and onto the polishing area atop the platen assembly 14. Hence, the slurry flow control mechanism 54 and the slurry conduit 56 selectively introduce a flow of slurry (as indicated by arrow 58) atop the polishing pad 22.

The CMP arrangement 10 also includes a nonaqueous solvent storage system 72. Similar to the chemical slurry system 50, the nonaqueous solvent storage system 72 includes a nonaqueous solvent flow control mechanism, and a nonaqueous solvent conduit 74. The a nonaqueous solvent storage system 72 can include one or more containers for storing nonaqueous solvents. In particular, the nonaqueous solvent storage system 72 can contain one or more nonaqueous solvents which are mixed or contained in separate containers. What is meant herein by nonaqueous solvent is a solvent which is substantially free of water. For example, a nonaqueous solvent is a solvent in which the weight percentage of water in the solvent is less than or equal to a deminimis amount which would normally occur in a solvent as a result of the solvent being exposed to its ambient surroundings during processing, transportation, and use thereof. It should be understood that the nonaqueous solvents which are utilized in the present invention are substances which possess chemical characteristics such that they are capable of dissolving the well known residue and reaction products generated by the CMP process (e.g. oxidized copper, oxidized Ta, and copper-BTA complexes) while leaving the dielectric and underlying metal on the semiconductor wafer surface intact (i.e. the dielectric and underlying unoxidized metal are not dissolved by the nonaqueous solvent).

Nonaqueous solvents which can be utilized in the present invention include organic solvents, such as, alcohols, hydrocarbons, or halogenated hydrocarbons. However, it should be understood that inorganic nonaqueous solvents can also be employed in the present invention. Specific nonaqueous solvents which can be used in the present invention include dimethylsulfoxide (DMSO), N,N-propanalamide, analine, N,N-dimethylanaline, and ammines. Preferably, the nonaqueous solvent utilized in the present invention is polar rather than nonpolar.

The CMP arrangement further includes an extraction flow control mechanism 70 having an extraction conduit 78. Extraction flow control mechanism 70 removes effluent from the polishing area atop the platen assembly 14. The effluent removed by extraction flow control mechanism 70 is then advanced to a storage area (not shown).

The CMP arrangement 10 also includes a controller 60 for controlling the CMP arrangement 10 in order to effectuate the desired polishing results for the semiconductor wafer 26. In particular, the controller 60 is electrically coupled to the displacement mechanism 36 via a signal line 62 to monitor and controllably adjust the polishing path of the semiconductor wafer 26 and the speed at which the semiconductor wafer 26 is moved across the platen assembly 14.

Moreover, the controller 60 is electrically coupled to the platen motor 12 via a signal line 64 in order to monitor the output speed of the platen motor 12 and hence the rotational velocity of the platen assembly 14. The controller 60 adjusts the output speed of the platen motor 12 and hence the rotational velocity of the platen assembly 14 as required by predetermined operating parameters.

The controller 60 is electrically coupled to the slurry flow control mechanism 54 via a signal line 66 in order to monitor the flow rate of the aqueous chemical slurry onto the polishing pad 22 of the platen assembly 14. The controller 60 adjusts the flow rate of the chemical slurry onto the polishing pad 22 of the platen assembly 14 as required by predetermined operating parameters.

The controller 60 is electrically coupled to the nonaqueous solvent storage system 72 and nonaqueous solvent flow control mechanism via a signal line 76 in order to monitor the flow rate of the nonaqueous solvent onto the polishing pad 22 of the platen assembly 14. The controller 60 adjusts the flow rate of the nonaqueous solvent onto the polishing pad 22 of the platen assembly 14 as required by predetermined operating parameters. It should be understood that advancing the nonaqueous solvent onto the polishing pad 22 also brings the nonaqueous in contact with front side 24 of semiconductor wafer 26.

The controller 60 is also electrically coupled to the wafer carrier motor 34 via a signal line 68 in order to monitor the output speed of the wafer carrier motor 34 and hence the rotational velocity of the wafer carrier 30. The controller 60 adjusts the output speed of the wafer carrier motor 34 and hence the rotational velocity of the wafer carrier 30 as required by predetermined operating parameters.

The controller 60 is further electrically coupled to the extraction flow control mechanism 70 via a signal line 80 in order to monitor the extraction of effluent from the polishing area atop the platen assembly 14.

In operation, the CMP arrangement 10 polishes the semiconductor wafer 26 in order to planarize the front side 24 thereof. In particular the CMP arrangement 10 removes material from the front side 24 of the semiconductor wafer 10, until the wafer 26 is polished down to a desired polishing endpoint. More specifically, the wafer carrier 30 engages the back side 44 of the semiconductor wafer 26 and presses the front side 24 of the semiconductor wafer 26 against the polishing pad 22. The controller 60 then causes the platen motor 12 to rotate the platen assembly 14 and the wafer carrier motor 34 to rotate the wafer carriers 30. The controller 60 may also begin to control the displacement mechanism 36 so as to move the wafer carrier 30 along a predetermined polishing path. The slurry flow control mechanism 54 is also controlled by the controller 60 in order to apply aqueous chemical slurry to the polishing pad 22 at a predetermined flow rate. In addition, the controller 60 causes the extraction flow control mechanism 70 to extract effluent from the polishing area of the platen assembly 14 at a predetermined flow rate. The resulting complex movement of the wafer carrier 30 relative to the polishing pad 22, the force being applied to the semiconductor wafer 26 in the general direction of arrow 38 of FIG. 1, and the aqueous chemical slurry all cooperate to selectively remove material from the front side 24 of the semiconductor wafer 26 until a predetermined end point is achieved, i.e. an appropriate amount of material has been removed from the front side 24 of semiconductor wafer 26.

Once the aforementioned predetermined endpoint has been reached, controller 60 causes the semiconductor wafer 26 to be rinsed with the nonaqueous solvent. In particular, controller 60 causes slurry flow control mechanism 54 to stop applying aqueous chemical slurry to the polishing pad 22. In addition, if desired, controller 60 stops the relative movement between polishing pad 22 and semiconductor wafer 26. Furthermore, if desired, controller 60 may cause wafer carrier 30 to decrease the force applied in the general direction of arrow 38 so as to facilitate the advancement of the nonaqueous solvent into contact with the front side 24 of semiconductor wafer 26. Controller 60 then causes nonaqueous solvent storage system 72 to advance a volume of the nonaqueous solvent through nonaqueous solvent conduit 74 and onto the polishing area atop the platen assembly 14. The volume of nonaqueous solvent advanced onto the polishing area atop the platen assembly 14 should be sufficient such that front side 24 of semiconductor wafer 26 is rinsed or bathed in the nonaqueous solvent thereby dissolving and selectively removing the residue and reaction products generated by the CMP process from the semiconductor wafer 26.

Once semiconductor wafer 26 is rinsed by the nonaqueous solvent in the above described manner, the semiconductor wafer 26 can proceed and be subjected to other steps in the fabrication process, for example scrubbing and the layering of additional material onto semiconductor wafer 26.

Figure 2:
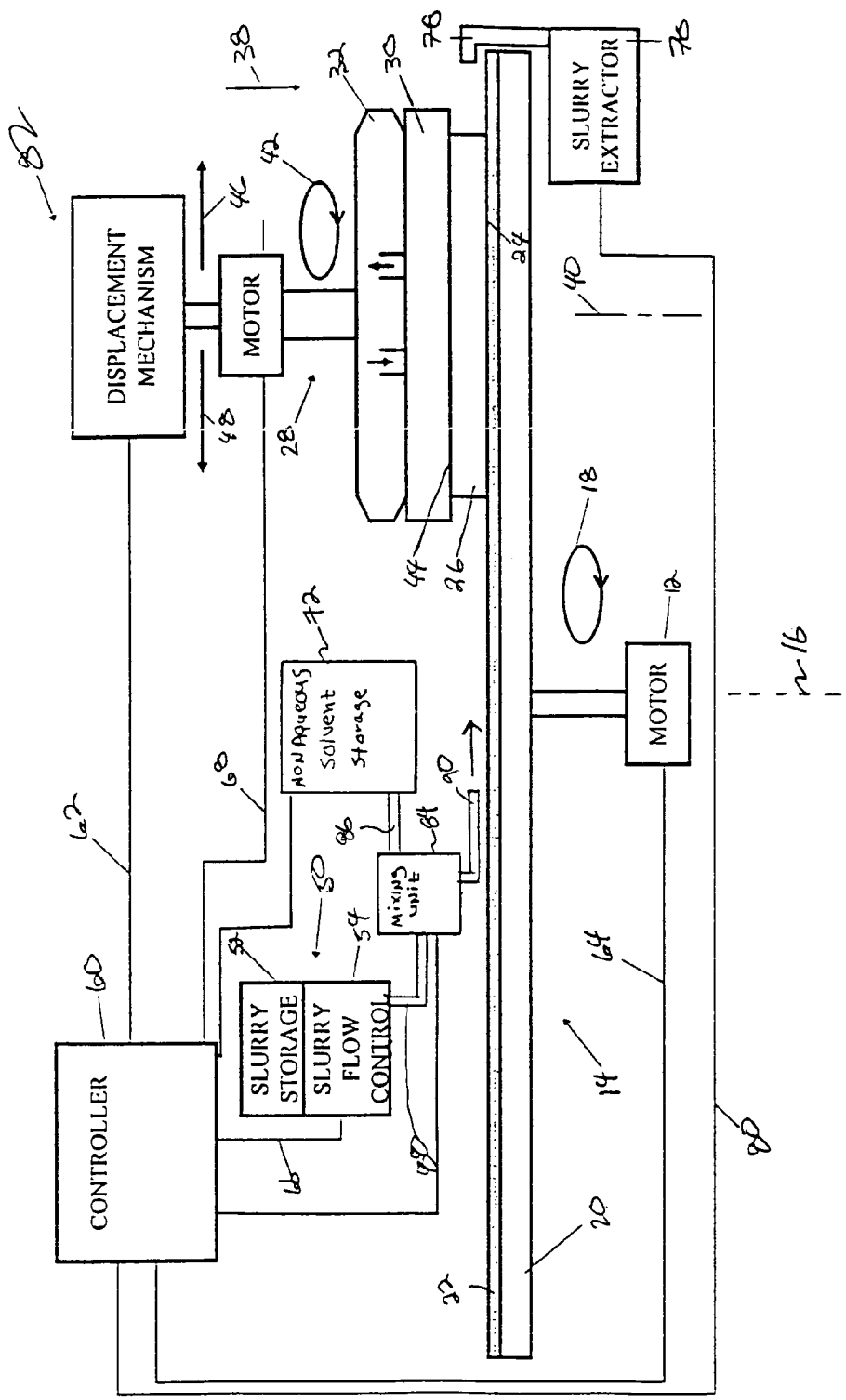
FIG. 2 shows a schematic representation of an alternative CMP arrangement of the present invention.

Now turning to FIG. 2, there is schematically shown an alternative CMP arrangement 82 of the present invention. The structure, operation, and function of CMP arrangement 82 is substantially similar to the previously discussed CMP arrangement 10, and thus only the differences between CMP arrangement 82 and CMP arrangement 10 will be discussed herein. In particular, the nonaqueous solvent storage system 72 and the chemical slurry system 50 of CMP arrangement 82 are in fluid communication with a mixing unit 84 rather than being coupled to conduits which lead directly to the polishing area atop the platen assembly 14. Specifically, nonaqueous solvent storage system 72 and chemical slurry system 50 are in fluid communication with the mixing unit 84 via conduits 86 and 88, respectively, and mixing unit 84 is coupled to a conduit 90 which leads to the polishing area.

The operation of CMP arrangement 82 is substantially similar to that described above for CMP arrangement 10, with the exception that rather than dispose an aqueous chemical slurry onto the polishing area via slurry conduit 56 followed by a nonaqueous solvent rinse being disposed onto the polishing area via nonaqueous solvent conduit 74, both the aqueous chemical slurry and the nonaqueous solvent are first advanced into mixing unit 84 via conduit 88 and 86, respectively. Once located in mixing unit 84, the aqueous chemical slurry and the nonaqueous solvent are mixed. The aqueous chemical slurry/nonaqueous solvent mixture is then disposed onto the polishing area via conduit 90. However, it should be understood that controller 60 controls the amount of aqueous chemical slurry and nonaqueous solvent advanced into mixing unit 84 so that at the beginning of the polishing process only aqueous chemical slurry is advanced into mixing unit 84 and thus onto the polishing area, but as the polishing process continues, controller 60 gradually increases the amount of the nonaqueous solvent and decreases the amount of aqueous chemical slurry present in the mixing unit 84 until substantially all of the fluid being disposed onto the polishing area is nonaqueous solvent near the end of the polishing process (i.e. reaching the desired polishing endpoint). In other words, as the polishing process proceeds the weight % of the nonaqueous solvent in the aqueous chemical slurry/nonaqueous solvent mixture (i.e. the fluid disposed onto the polishing area) increases until substantially all of the fluid being disposed onto the polishing area is nonaqueous solvent near the end of the polishing process. The timing of disposing substantially pure (i.e. substantially no aqueous chemical slurry present) nonaqueous solvent onto the polishing area should be synchronized with the polishing process reaching the desired endpoint. For example, it is preferable that the desired polishing end point be reached at the same time, or just prior to, disposing substantially pure nonaqueous solvent onto the polishing area. Accordingly, the nonaqueous solvent can function to rinse the front side 24 of semiconductor wafer 26, thereby dissolving and selectively removing the residue and reaction products generated by the CMP process from the semiconductor wafer 26.

As previously mentioned, once semiconductor wafer 26 is rinsed by the nonaqueous solvent in the above describe manner, the semiconductor wafer 26 can proceed and be subjected to other steps in the fabrication process, for example scrubbing and the layering of additional material onto semiconductor wafer 26.

It should be appreciated that rinsing a semiconductor wafer in the nonaqueous solvent selectively dissolves and removes the residue and reaction products generated by the CMP process from the semiconductor wafer surface. In particular, rinsing a semiconductor wafer in the nonaqueous solvent ensures that residue generated by a CMP process, such as oxidized copper, is removed in regions between conductors defined on the semiconductor wafer while unoxidized copper remains in the areas of the semiconductor wafer where it is needed. Accordingly, rinsing a semiconductor wafer in the nonaqueous solvent, thereby selectively dissolving and removing the residue and reaction products generated by the CMP process enhances the yield and/or reliability of the semiconductor wafer as compared to the process of subjecting a semiconductor wafer to an aqueous rinse after a CMP process.

While the invention has been illustrated and described in detail in the drawings and foregoing description, such illustration and description is to be considered as exemplary and not restrictive in character, it being understood that only a preferred embodiment has been shown and described and that all changes and modifications that come within the spirit of the invention are desired to be protected. For example, while the two above described examples disclose rinsing the semiconductor wafer with nonaqueous solvent while the semiconductor wafer is on the polishing area of the CMP arrangement, it is also contemplated that the semiconductor wafer can be completely removed from the CMP arrangement and rinsed on a separate rinsing arrangement. Furthermore, it is contemplated that the mixing of the nonaqueous solvent and the aqueous chemical slurry described in reference to FIG. 2 does not have to take place in mixing unit 84, but can be mixed by bypassing mixing unit 84 and simultaneously disposing both the nonaqueous solvent and the aqueous chemical slurry directly onto the polishing area of the CMP arrangement.

What is claimed is:

1. A method of fabricating a semiconductor wafer, comprising:
   (a) mixing an aqueous slurry containing an abrasive material and a nonaqueous solvent in a mixing unit so as to create a first volume of an aqueous slurry/nonaqueous solvent mixture with a first weight % of said nonaqueous solvent prior to being disposed onto said semiconductor wafer;
   (b) disposing said first volume of the aqueous slurry/nonaqueous solvent mixture containing an abrasive material onto said semiconductor wafer;
   (c) polishing the semiconductor wafer with a polishing pad using said first volume;
   (d) mixing said aqueous slurry containing an abrasive material and said nonaqueous solvent so as to create a second volume of an aqueous slurry/nonaqueous solvent mixture having a greater weight % of said nonaqueous solvent than said first weight % prior to being disposed onto said semiconductor wafer;
   (e) disposing said second volume of said aqueous slurry/nonaqueous solvent mixture containing an abrasive material onto said semiconductor wafer; and
   (f) polishing said semiconductor wafer using said second volume.

2. The method of claim 1, further comprising:
   decreasing the force applied to said polishing pad or said semiconductor wafer after disposing said first volume of said aqueous slurry/nonaqueous solvent mixture onto said semiconductor wafer and before completing disposing said second volume of said aqueous slurry/nonaqueous solvent mixture onto said semiconductor wafer.

3. The method of claim 1, wherein said disposing said second volume of aqueous slurry/nonaqueous solvent mixture further comprises:
   disposing said second volume of aqueous slurry/nonaqueous solvent mixture during said polishing of said semiconductor wafer.

4. The method of claim 3, wherein mixing said second volume of an aqueous slurry/nonaqueous solvent mixture is performed at least partially simultaneously with disposing said first volume onto said semiconductor wafer, and mixing said second volume comprises:
   controlling a flow of said nonaqueous solvent into said mixing unit.

5. The method of claim 3, wherein:
   said weight % of said nonaqueous solvent in said aqueous slurry/nonaqueous solvent mixture is gradually increased from the weight % of the first volume until said aqueous slurry/nonaqueous solvent mixture is substantially free of said aqueous slurry during said polishing.

6. The method of claim 1, wherein:
   said nonaqueous solvent includes an amine.

7. The method of claim 1, wherein:
   said nonaqueous solvent includes dimethylsulfoxide.

8. The method of claim 1, wherein:
   said nonaqueous solvent includes N,N-propanalamide.

9. The method of claim 1, wherein:
   said nonaqueous solvent includes analine.

10. The method of claim 1, wherein:
    said nonaqueous solvent includes N,N-dimethlyanaline.

11. A method of fabricating a semiconductor wafer, comprising:

(a) disposing a volume of an aqueous slurry containing an abrasive material onto a semiconductor wafer and polishing the semiconductor wafer with a polishing pad, said polishing pad in contact with said semiconductor wafer when said volume of aqueous slurry is disposed onto said semiconductor wafer;

(b) disposing a volume of nonaqueous liquid including a nonaqueous solvent onto said semiconductor wafer to rinse the semiconductor wafer; and (c) facilitating the advancement of the nonaqueous liquid into contact with the semiconductor wafer by decreasing the force applied to said polishing pad or said semiconductor wafer prior to completing disposing the volume of nonaqueous liquid including the nonaqueous solvent onto said semiconductor wafer.

12. The method of claim 11, wherein:
said nonaqueous solvent includes an amine.

13. The method of claim 11, wherein:
said nonaqueous solvent includes dimethylsulfoxide.

14. The method of claim 11, wherein:
said nonaqueous solvent includes N,N-propanalamide.

15. The method of claim 11, wherein:
said nonaqueous solvent includes analine.

16. The method of claim 11, wherein:
said nonaqueous solvent includes N,N-dimethlyanaline.

17. The method of claim 11, wherein step c) further comprises decreasing the force applied by said polishing pad on said semiconductor wafer during the disposing of the volume of nonaqueous liquid including the nonaqueous solvent onto said semiconductor wafer.

18. A method of fabricating a semiconductor wafer, comprising:

(a) subjecting a front side of said semiconductor wafer to chemical mechanical polishing using an aqueous slurry; and (b) disposing, a volume of nonaqueous liquid including a nonaqueous solvent onto said front side of said semiconductor wafer during said chemical mechanical polishing to rinse said semiconductor wafer, wherein:
said nonaqueous solvent includes an amine.

19. The method of claim 18, further comprising:
decreasing the force applied to a polishing pad on said front side of said semiconductor wafer prior to completing disposing a volume of nonaqueous liquid including a nonaqueous solvent onto said front side of said semiconductor wafer.

20. The method of claim 19, wherein decreasing the force applied further comprises decreasing the force applied during, and prior to completing, the disposing of the volume of nonaqueous liquid including the nonaqueous solvent onto said semiconductor wafer.

* * * * *